United States Patent [19]

Debély

[11] 4,384,232
[45] May 17, 1983

[54] GROOVED-ELECTRODE PIEZOELECTRIC RESONATOR

[75] Inventor: Pierre Debély, Geneva, Switzerland

[73] Assignee: Ebauches, S.A., Switzerland

[21] Appl. No.: 195,775

[22] Filed: Oct. 10, 1980

[30] Foreign Application Priority Data

Oct. 15, 1979 [FR] France ............................. 79 25562

[51] Int. Cl.³ ........................................... H01L 41/04
[52] U.S. Cl. ................................. 310/370; 310/365; 310/368
[58] Field of Search ............... 310/365, 366, 368, 370; 333/191, 32

[56] References Cited

U.S. PATENT DOCUMENTS 3,059,130 10/1962 Robins ............................. 310/365
3,576,453 4/1971 Mason ............................. 310/366
3,760,172 9/1973 Quate ............................. 310/334
4,205,248 5/1980 Negita ............................. 310/370

Primary Examiner—J. D. Miller
Assistant Examiner—Don Rebsch
Attorney, Agent, or Firm—Allegretti, Newitt, Witcoff & McAndrews, Ltd.

[57] ABSTRACT

A tuning fork resonator has electrodes 7 and 8 on the opposite main surfaces of each tine and lateral electrodes 9 and 11 along the edges of each tine. The electrodes 7 and 8 of one tine are connected to the electrodes 9 and 11 of the other tine and to one pole of the supply. The other electrodes are similarly connected to the other pole. The electric fields extend parallel to the main surfaces of the tines. In order to improve the uniformity and density of the fields, grooves 4 and 5 are etched along one main surface of each tine and the electrode 8 has parts extending into the grooves. Various modifications are possible including omission of the part of the central electrode between the grooves, provision of a single, central longitudinally groove and the provision of opposing grooves in both main surfaces. Electrical power consumption is reduced.

9 Claims, 6 Drawing Figures

GROOVED-ELECTRODE PIEZOELECTRIC RESONATOR

BACKGROUND OF THE INVENTION

The present invention relates to piezo-electric crystal resonators in which the electrical field of excitation is produced in a direction parallel to one of their surfaces by electrodes, certain ones of which are located on this surface, and particularly but not exclusively, resonators having the form of a tuning fork.

Piezo-electric crystal resonators are very useful for forming the time base in many kinds of electronic apparatus and equipment, including clocks and watches. In many applications, crystal resonators in the form of a tuning fork have proved to be extremely advantageous, particularly in view of the possibilities of miniaturization which they offer. However, in the same type of application it equally is desirable to reduce as far as possible the consumption of energy required to maintain vibrations of the tuning fork, especially when the energy is supplied by batteries of very small dimensions in portable devices such as watches or pocket calculators. The resonator according to the invention is designed in such a manner as to reduce the consumption of energy by producing an excitation electrical field which is more homogeneous and locally more intense than those in the known resonators. Accordingly, the invention is applicable not only to resonators in which the crystal is in the form of a tuning fork, but also to resonators of all other forms, with a field of excitation parallel to a surface of the crystal which carries an excitation electrode.

BRIEF SUMMARY OF THE INVENTION

According to the present invention, there is provided a piezoelectric resonator comprising a first electrode on one of its surfaces so as to produce, in conjunction with a second electrode, an electrical field in a direction substantially parallel to the said surface and a groove in the said surface, the first electrode being located at least partly in this groove.

In the tuning fork resonators which have previously been described, for example in U.S. Pat. No. 3,969,641 (particularly in FIG. 1 thereof), the tuning fork, which is typically made of quartz, has two parallel tines separated by a gap, each of which tines carries conductive deposits forming electrodes of opposite polarity which make it possible to produce in the tines an alternating electrical field which brings about the vibration of the tuning fork by piezoelectric deformation. The electrodes are arranged and connected to the source of energy in such a manner that this field will be produced, in each tine in the plane of the tines, transversely with respect to their length, with a phase displacement of a half period between the two tines.

In practicing the invention, at least one groove having a depth less than the thickness of the tuning fork is cut longitudinally in each of the tines, at least in a first one of the main surfaces of the tine. The excitation electrodes comprise, on each tine, central electrodes on the opposite main surfaces of the tine, lateral electrodes covering the lateral edges of the tines of the tuning fork, at least one of the central electrodes of each tine being wholly or partially in a groove or grooves in its respective main surface.

The electrodes are designed to be electrically connected, in a manner which is known per se, the central electrodes of one tine and the lateral electrodes of the other tine being connected to one of the poles of the source of excitation and, conversely, the central electrodes of the second tine and the lateral electrodes of the first tine being connected to the opposite pole. These connections can be formed to a considerable extent by electrically conductive coatings deposited on the tuning fork itself. In operation, it is thus possible to maintain the vibrations of the resonator by flexion of the tines of the tuning fork resulting from an alternating transverse electrical field in the plane of the tines.

Referring by way of example to the particular case of the application of the invention to tuning fork resonators, the disposition of the central electrodes in the thickness of the tines increases the piezoelectric coupling. With equal dimensions, this increase brings with it an increase in the quality factor (Q) of the resonator and hence a diminution of the consumption of the oscillator with which it is associated, as a result of the reduction of the series resistance representing the losses in the equivalent conventional resonator circuit. Conversely, with the same quality factor, this arrangement enables the dimensions of the resonator to be reduced.

In one illustrative construction, a single groove is provided in each tine. The size of these grooves is then such that their flanks are located as near as possible to the lateral edges of the tines so far as the maintenance of a good mechanical strength of the resonator and the techniques of manufacture thereof will allow. Subject to the same reservations, these grooves are advantageously as deep as possible.

It furthermore is desirable to ensure that the zones located between the grooves and the lateral edges of the branches are sufficiently rigid and are connected to the central part of the tines in a likewise sufficiently rigid manner for them to be capable of imparting vibration to the entire tuning fork. This last-mentioned constraint, however, is observed in any case because of the limits imposed by the techniques of manufacture on the distance separating the flanks of the grooves from the lateral edges of the tines.

In practice, the thickness of material left beneath the grooves and the distance between the flanks of the grooves and the lateral edges of the tines of the resonator is advantageously kept to a value equal to at least a third of the thickness of the resonator.

Such grooves may be provided in only one main surface of the resonator, the other surface then being flat, or in both main surfaces. In this latter case, the section of the tines is symmetrical, which avoids deformations of the tines out of the planes of their main surfaces.

It is known that the mode of vibration of a resonator depends, inter alia, on the length of the excitation electrodes. One therefore obviously selects the length of the grooves in each case as a function of the desired mode of vibration.

If the grooves provided in one of the main surfaces of the resonator or in both of these main surfaces are sufficiently large, an economy of electrode material can be achieved by dividing the central electrode in two parts located separately at least on the flanks of each groove and electrically connected to each other by one or more electrically conductive tracks. Indeed, only those parts of the central electrode which are situated on the flanks of the groove are useful for producing the excitation field of the resonator.

In another illustrative construction, two grooves are provided in one or in each main surface of each tine of the tuning fork. These grooves are located as near as possible to the lateral edges of the tines subject to the same reservations mentioned above.

It will be appreciated by those skilled in the art that the formation of the grooves presents no technological problem. In the course of well known processes for producing resonators by photo-lithography, metallic layers, usually of chrominium or of gold, are deposited on a quartz plate. These layers are partially removed, in such a manner as to leave only zones having the form of the resonators. The quartz plates are then etched with hydrofluoric acid to remove the parts that are not protected by the metallic layers.

In order to produce the grooves in only one of the surfaces of the resonators, it is sufficient to provide, at the desired locations, slots in the metallic layers protecting this surface. The quartz is then only attacked by the hydrofluoric acid through the slots on only one side, while the other parts that are not protected are attached on both surfaces. Thus, while the outline shape of the resonator is etched through by the hydrofluoric acid, the grooves are etched to a depth equal to about half the thickness of the quartz.

To obtain the grooves in both main surfaces of the resonator, supplementary steps must be included in the etching process. The etching by the hydrofluoric acid must be commenced with the metallic protective layers having the external shape of resonators without any slots having been provided at the locations for the grooves. This attack is discontinued before the quartz has been completely removed from around the resonators and the slots are then formed in the metallic layers at the places provided for the grooves. The etching by the hydrofluoric acid is then renewed until the quartz has been completely etched through around the resonators. The desired grooves are simultaneously formed in conformity with the slots formed in the metallic layers, and their depth depends on the duration of the second etching with hydrofluoric acid.

The deposition of the electrodes in the grooves is effected in the course of the same operation as the deposition of the electrodes on the lateral edges of the tuning fork.

BRIEF DESCRIPTION OF THE DRAWINGS

The invention will now be described in more detail, by way of example with reference to the accompanying drawings, in which.

DETAILED DESCRIPTION OF THE PREFERRED EMBODIMENTS

Figure 1:
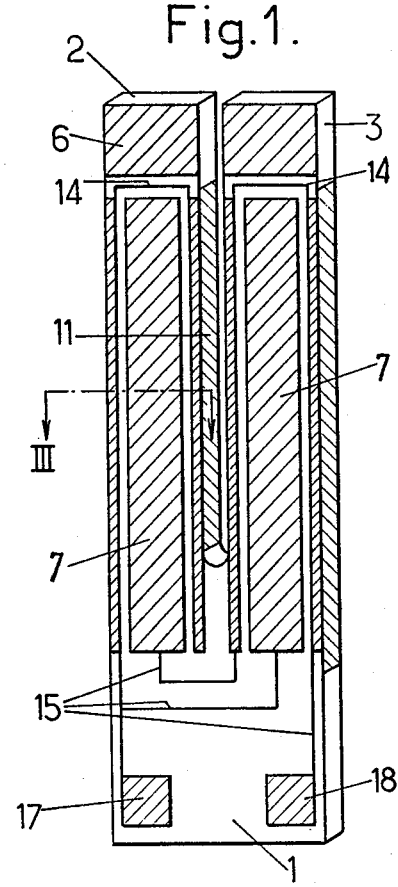
FIG. 1 shows a one illustrative resonator embodying the invention, as viewed on the side of one of its main surfaces.
Figure 2:
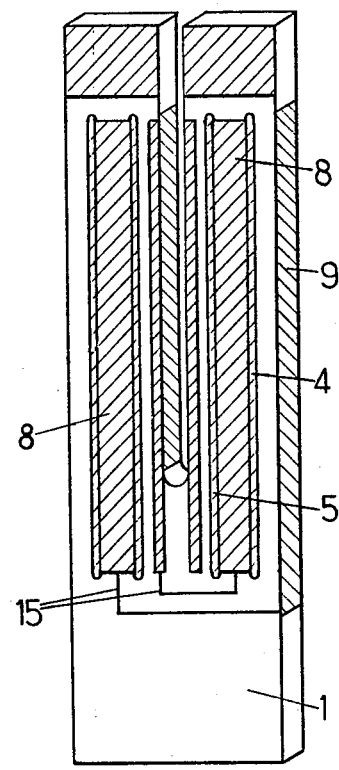
FIG. 2 shows the same resonator, as viewed on the side of the opposite main surface.

In FIGS. 1 and 2, the quartz resonator 1 has the form of a tuning fork with a central gap separating the two parallel tines 2 and 3. The width direction of these tines is parallel to the X axis of the crystal and their length direction makes an angle of in generally between 0 and 10 degrees with the Y axis. The tines are identical to each other and carry electrodes which are likewise identical, only the electrical connections for the supply of the resonator being different.

Figure 3:
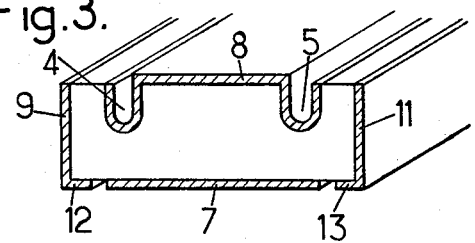
FIG. 3 is a section of one tine of the resonator taken on the line III in FIG. 1.

The front of the resonator (FIG. 1) is flat, while on the rear (FIG. 2) two longitudinal grooves 4, 5 are cut in each tine, these grooves being shown only in the larger scale cross-section of FIG. 3. The grooves are relatively deep and narrow and are located close to the lateral edges of the tines. By way of example, for a thickness of the resonator of 72.5 microns and a tine width three to four times as great, the grooves can be formed at a distance of about 50 microns from each lateral edge and can have a depth of about 50 microns.

For the electric supply to the resonator, the excitation electrodes and their connections and contact areas all are constituted by conductive coatings deposited on the surface of the resonator, in this case deposits of gold applied by vacuum deposition. Supplementary deposits of gold are formed at 6 on the end parts of the tines of the tuning fork in order to enable the natural frequency of the resonator to be adjusted in the usual manner by removal of material with the aid of a laser beam.

Essentially, each tine carries two central electrodes and two lateral electrodes. The central electrodes are formed on the two main surfaces of the tine, i.e., an electrode 7 on the front surface and an electrode 8 on the rear surface. On the rear surface, the conductive coating forming the electrode 8 covers the surface of the quartz continuously at the bottom and on the sides of the two grooves 4 and 5 as well as between the grooves. The lateral electrodes 9 and 11 cover the lateral edges of the tine. They lap round onto only one of the main surfaces of the tine, namely onto the main surface which is devoid of grooves, as marginal portions 12 and 13 respectively which extend along the margins of the tines of the tuning fork flanking each central electrode 7.

Near the ends of the tines, conductive tracks 14 interconnect the two lateral electrodes of each tine. Adjacent the base of the fork, which is common to the two tines, other conductive tracks 15 connect each central electrode 7 to one lateral electrode belonging to the other tine, and in addition they provide the connections with the contact areas 17 and 18. Each of the contact areas is electrically connected with the central electrode of one of the tines of the tuning fork and the two lateral electrodes of the other tine. The supply of the resonator for initiating and maintaining its vibration is effected by the usual means via these contact areas 17, 18.

Figure 5:
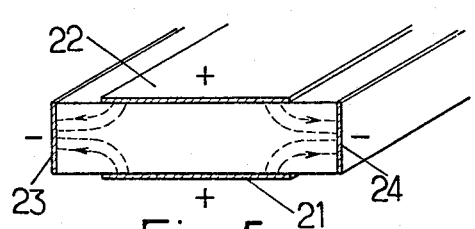
FIG. 5 shows, for comparison with FIG. 4, the lines of force of the electrical field produced in a known resonator without grooves.

The presence of the grooves 4, 5 favours the production of a homogeneous electrical field along the X axis of the crystal. Their function is illustrated by the comparative FIGS. 4 and 5, on which the lines of force of the field produced in operation have been indicated on sections of one tine of the resonator. In the case of FIG. 5, the tuning fork has no grooves, but the central electrodes 21, 22 cooperate with lateral electrodes 23, 24 provided in a known manner on the edges of the tines.

Figure 4:
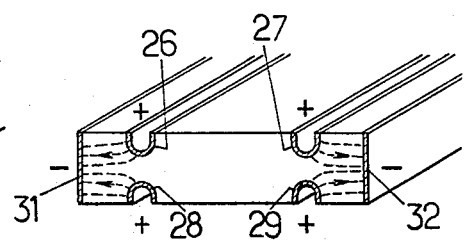
FIG. 4 illustrates a modified resonator embodying the invention by means of a perspective view of one tine thereof.

In the resonator according to the invention shown in FIG. 4, not only is the rear surface formed with grooves 26, 27 similar to those 4, 5 of the embodiment previously described, but, in addition, symmetrical grooves 28, 29 are likewise formed in the front main surface of the tine. The lateral electrodes 31, 32 are formed in this example only on the edges of the resonator, without marginal extensions onto a main surface, and the deposits of gold which constitute the central electrodes are divided into two parts on each main surface, only the wall surfaces of the grooves being coated. The two parts are naturally connected to the same pole of the supply source by means of conductive tracks (not shown) which connect them together at the ends of the grooves. The grooves are less deep than in FIG. 3 in order to maintain between them a sufficient thickness of quartz, for example about 50 microns.

Figure 6:
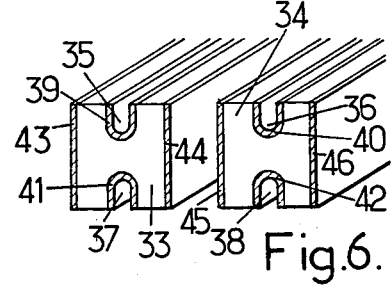
FIG. 6 is a perspective view of two tines of another modified tuning fork resonator embodying the invention.

FIG. 6 is a section of the two tines 33 and 34 of a tuning fork according to another illustrative construction. Grooves 35, 36, 37 and 38 are cut in these branches, one of these grooves being cut in each main surface of each tine. The central electrodes 39, 40, 41 and 42 are deposited on the walls of these grooves and cooperate with the lateral electrodes 43, 44, 45 and 46 to produce, as in the above examples, the transverse field necessary for setting the tuning fork in vibration.

Various other modifications may be made in the form of the invention without departing from the spirit and principles of the invention as disclosed in the foregoing illustrative embodiments. It, therefore, is intended that the accompanying claims be construed as broadly as possible to cover various embodiments of the invention as is consistent with the prior art.

What is claimed is:

1. A tuning fork piezoelectric resonator having two substantially coplanar and parallel tines comprising each:
   first and second substantially parallel main surfaces and first and second edge surfaces substantially perpendicular to said main surfaces;
   a first groove disposed in said first main surface in a direction substantially parallel to said edge surfaces; and
   means for producing an electrical field in a direction substantially parallel to said main surfaces including a first electrode located at least partially in said groove and a second and a third electrode disposed each on one of said edge surfaces.

2. The resonator of claim 1, wherein said first groove is substantially equidistant from said edge surfaces.

3. The resonator of claims 1 or 2, wherein said first electrode comprises two electrically connected parts disposed each on one of the flanks of said first groove.

4. The resonator of claim 1, wherein each of said tines further comprises a second groove disposed in said second main surface in a direction substantially parallel to said edge surfaces, and said electrical field producing means further includes a fourth electrode located at least partially in said second groove.

5. The resonator of claim 4, wherein said first and second grooves are substantially equidistant from said edge surfaces.

6. The resonator of claims 4 or 5 wherein said first and said fourth electrodes comprise each two electrically connected parts disposed each on one of the flanks of said first, and respectively said second groove.

7. The resonator of claim 1, wherein each of said tines further comprises a second groove disposed in said first main surface in a direction substantially parallel to said edge surfaces, and said first electrode comprises two electrically connected parts located each, at least partially, in one of said first and second grooves.

8. The resonator of claim 7, wherein the distance of said first groove to said first edge surface is substantially equal to the distance of said second groove to said second edge surface.

9. The resonator of claims 7 or 8, wherein each of said tines further comprises a third and a fourth groove disposed in said second main surface substantially opposite said first, and respectively said second groove, and said electrical field producing means further includes a fourth electrode comprising two electrically connected parts located each, at least partially, in one of said third and fourth grooves.

* * * * *